(12) United States Patent
St. Amand et al.

(10) Patent No.: US 12,051,611 B2
(45) Date of Patent: *Jul. 30, 2024

(54) CARRIER ASSISTED SUBSTRATE METHOD OF MANUFACTURING AN ELECTRONIC DEVICE AND ELECTRONIC DEVICE PRODUCED THEREBY

(71) Applicant: Amkor Technology Singapore Holding Pte. Ltd., Singapore (SG)

(72) Inventors: Roger St. Amand, Tempe, AZ (US); Young Do Kweon, Chandler, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/328,782

(22) Filed: May 24, 2021

(65) Prior Publication Data
US 2022/0059387 A1 Feb. 24, 2022

Related U.S. Application Data

(63) Continuation of application No. 16/446,231, filed on Jun. 19, 2019, now Pat. No. 11,018,040.

(51) Int. Cl.
*H01L 21/44* (2006.01)
*H01L 21/48* (2006.01)
(Continued)

(52) U.S. Cl.
CPC ...... *H01L 21/6835* (2013.01); *H01L 21/4853* (2013.01); *H01L 21/4857* (2013.01); *H01L 21/561* (2013.01); *H01L 21/563* (2013.01); *H01L 21/568* (2013.01); *H01L 21/78* (2013.01); *H01L 23/3128* (2013.01); *H01L 23/49822* (2013.01); *H01L 24/97* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2221/68377* (2013.01); *H01L 2221/68381* (2013.01); *H01L 2224/16227* (2013.01);
(Continued)

(58) Field of Classification Search
CPC ............ H01L 21/6835; H01L 21/4853; H01L 21/4857; H01L 21/561; H01L 21/568; H01L 23/49822; H01L 24/97; H01L 2221/68377; H01L 2221/68381; H01L 2224/81005; H01L 2224/83005; H01L 2224/95001
USPC .......................................... 438/126
See application file for complete search history.

(56) References Cited

U.S. PATENT DOCUMENTS 9,704,735 B2 * 7/2017 Konchady ........... H01L 21/6835
9,929,072 B2 * 3/2018 Gerber .................... H01L 23/34
(Continued)

FOREIGN PATENT DOCUMENTS

JP 5537016 B2 * 7/2014

*Primary Examiner* — Caleb E Henry
*Assistant Examiner* — Dilinh P Nguyen
(74) *Attorney, Agent, or Firm* — McAndrews, Held & Malloy, Ltd.

(57) ABSTRACT

An electronic device structure and a method for making an electronic device. As non-limiting examples, various aspects of this disclosure provide a method of manufacturing an electronic device that comprises the utilization of a carrier assisted substrate, and an electronic device manufactured thereby.

14 Claims, 7 Drawing Sheets

(51) Int. Cl.
*H01L 21/56* (2006.01)
*H01L 21/683* (2006.01)
*H01L 21/78* (2006.01)
*H01L 23/00* (2006.01)
*H01L 23/31* (2006.01)
*H01L 23/498* (2006.01)

(52) U.S. Cl.
CPC .............. *H01L 2224/32225* (2013.01); *H01L 2224/73204* (2013.01); *H01L 2224/81005* (2013.01); *H01L 2224/81815* (2013.01); *H01L 2224/83005* (2013.01); *H01L 2224/83203* (2013.01); *H01L 2224/92125* (2013.01); *H01L 2224/95001* (2013.01)

(56) References Cited

U.S. PATENT DOCUMENTS

| | | | |
|---|---|---|---|
| 10,629,469 B2* | 4/2020 | Konchady | H01L 23/5389 |
| 2011/0298102 A1 | 12/2011 | Yoo et al. | |
| 2018/0323170 A1 | 11/2018 | Kim et al. | |
| 2019/0096849 A1* | 3/2019 | Woychik | H01L 23/13 |
| 2020/0243461 A1 | 7/2020 | Chiang et al. | |

* cited by examiner

Figure 2G

CARRIER ASSISTED SUBSTRATE METHOD OF MANUFACTURING AN ELECTRONIC DEVICE AND ELECTRONIC DEVICE PRODUCED THEREBY

CROSS-REFERENCE TO RELATED APPLICATION

This application is a continuation of U.S. patent application Ser. No. 16/446,231, filed Jun. 19, 2019, and titled "Carrier Assisted Substrate Method of Manufacturing an Electronic Device and Electronic Device Produced Thereby," expected to issue as U.S. Pat. No. 11,018,040; which is related to U.S. patent application Ser. No. 14/823,689, filed Aug. 11, 2015 and titled "SEMICONDUCTOR PACKAGE AND FABRICATING METHOD THEREOF," now U.S. Pat. No. 9,543,242; the entire contents of each of which are hereby incorporated herein by reference.

BACKGROUND

Present electronic device packages and methods for forming electronic devied packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings.

SUMMARY

Various aspects of this disclosure provide an electronic device structure and a method for manufacturing an electronic device. As non-limiting examples, various aspects of this disclosure provide a method of manufacturing an electronic device that comprises the utilization of a carrier assisted substrate, and an electronic device manufactured thereby.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, the term "and/or" (and the term "or") means any one or more of the items in the list joined by the term "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

Various aspects of the present disclosure provide an electronic device (e.g., a semiconductor device or package) and a fabricating (or manufacturing) method thereof, which can decrease the size, decrease the cost, increase the reliability, increase the electrical performance, and/or increase the manufacturability of the electronic device.

The above and other aspects of the present disclosure will be described in or be apparent from the following description of various example implementations. Various aspects of the present disclosure will now be presented with reference to accompanying drawings, such that those skilled in the art may readily practice the various aspects.

Figure 1:
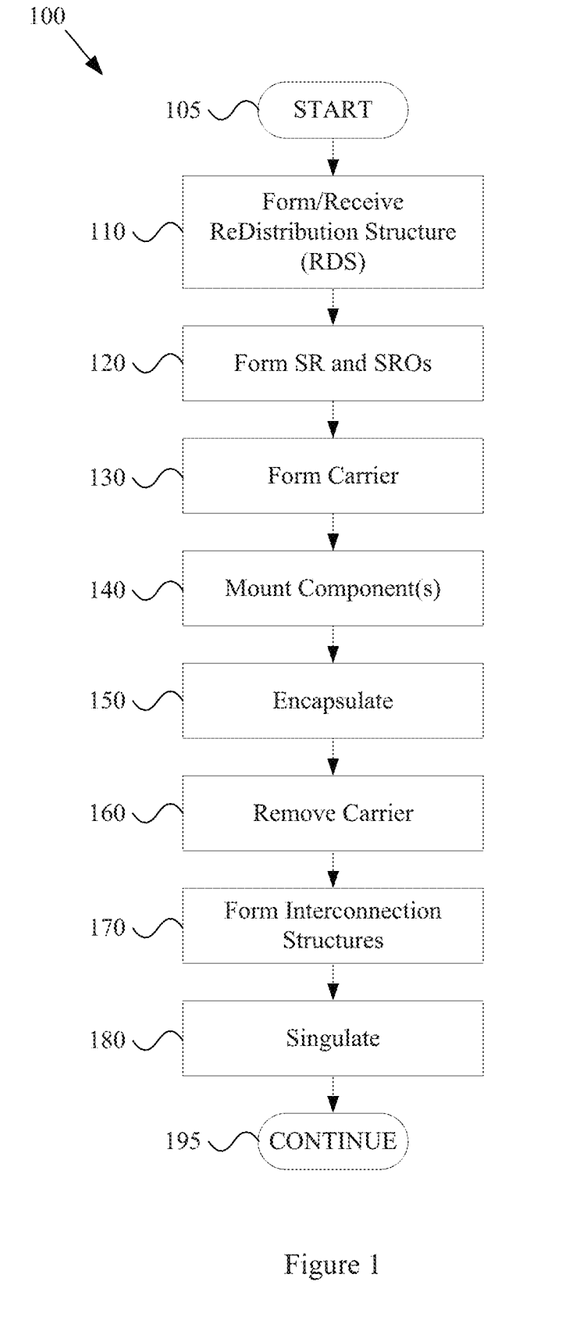
FIG. 1 is a flow diagram of an example method of making an electronic device, in accordance with various aspects of the present disclosure.

FIG. 1 is a flow diagram of an example method of making an electronic device, in accordance with various aspects of the present disclosure. FIGS. 2A-2G show cross-sectional views illustrating an example electronic device and an example method of making an electronic device, in accordance with various aspects of the present disclosure. FIGS. 2A-2G may, for example, illustrate an example electronic device at various steps (or blocks) of the method 100 of FIG. 1. FIGS. 1 and 2A-2G will now be discussed together. It should be noted that the order of the example blocks of the method 100 may vary without departing from the scope of this disclosure.

The example method 100 may, at block 105, comprise beginning execution. The example method 100 may comprise beginning execution in response to any of a variety of causes or conditions, non-limiting examples of which are provided herein. For example, the block 105 may comprise receiving a method flow from any of the method blocks of the example method 100 discussed herein. Also for example, the example method 100 may comprise beginning execution in response to an order for an electronic device (or a portion thereof) being received. Additionally for example, the example method 100 may comprise beginning execution in response to the availability of components of the electronic device, the completion of an upstream manufacturing process, etc.

Figure 2A:
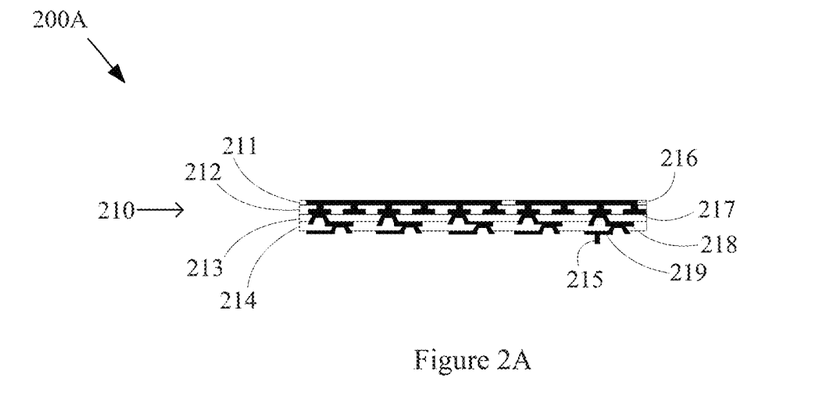
FIGS. 2A-2G show cross-sectional views illustrating an example electronic device and an example method of making an electronic device, in accordance with various aspects of the present disclosure.

The example method 100 may, at block 110, comprise forming and/or receiving a redistribution structure ("RDS"). The RDS may, for example, comprise a substrate (coreless or cored), an interposer, etc. Block 110 may comprise forming and/or receiving a redistribution structure ("RDS") in any of a variety of manners, non-limiting examples of which are provided herein. FIG. 2A provides an example illustration of various aspects of block 110. Referring to FIG. 2A, an example structure 200A showing an example RDS 210 is presented. Although not shown, either side of the example RDS 210 may be coupled to a support structure.

The example RDS 210 may, for example, comprise a plurality of dielectric layers (or dielectric material) comprising, for example, a first dielectric layer 211, a second dielectric layer 212, a third dielectric layer 213, and a fourth dielectric layer 214. The example RDS 210 may also, for example, comprise a plurality of conductive layers (or conductive material) comprising, for example, a first conductive layer 216, a second conductive layer 217, a third conductive layer 218, and a fourth conductive layer 219. The example RDS 210 may further, for example, comprise a fiducial 215 (e.g., a conductor or conductive layer) or a plurality of fiducials.

The example RDS 210 may be received on a carrier, on tooling, as a stand-alone entity, as a wafer of single RDS 210 to be singulated (or diced) etc. In a scenario in which the RDS 210 is formed, the dielectric and conductive layers may be sequentially formed layer-by-layer. Various examples of such forming are provided in U.S. patent application Ser. No. 14/823,689, filed Aug. 11, 2015 and titled "SEMICONDUCTOR PACKAGE AND FABRICATING METHOD THEREOF," now U.S. Pat. No. 9,543,242, the contents of which are hereby incorporated herein by reference in their entirety for all purposes.

The dielectric layers 211-214 (or material(s)) may, for example, comprise one or more layers of any of a variety of dielectric materials, for example inorganic dielectric materials (e.g., $Si_3N_4$, $SiO_2$, SiON, SiN, oxides, nitrides, combinations thereof, equivalents thereof, etc.) and/or organic dielectric materials (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

The dielectric layers 211-214 (or material(s)) may, for example, be formed using any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The conductive layers 216-219 (or material(s)) may, for example, comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

The conductive layers 216-219 (or material(s)) may, for example, be formed or deposited utilizing any one or more of a variety of processes (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

In an example scenario, the dielectric layers 211-214 and the conductive layers 216-219 may be formed sequentially in an alternating fashion. For example a dielectric layer may cover a conductive layer and also comprise apertures through which a next conductive layer may be formed to contact the conductive layer.

Though the example RDS 210 is shown with four example dielectric layers 211-214 and four example conductive layers 216-219, any number of such layers may be present. In an example implementation, the RDS 210 may be 100 microns thick or less. Also in an example implementation, traces (or pads or conductors) of the conductive layers 216-219 may have a sub-2.5-micron or sub-micron pitch (e.g., center-line to center-line spacing, space between adjacent traces or pads, etc.).

Note that though only a single RDS 210 for a single electronic device is shown in FIG. 2A and throughout the drawings, such showing is for illustrative clarify. Block 110 may, for example, comprise receiving and forming an RDS as a one of a plurality of RDSs in a wafer form (e.g., circular, etc.) in a panel form (e.g., rectangular or square, etc.), etc.

In general, block 110 may comprise forming and/or receiving a redistribution structure ("RDS"). Accordingly, the scope of various aspects of this disclosure should not necessarily be limited by particular aspects of any particular RDS and/or by particular aspects of any particular manner of forming or receiving an RDS.

Figure 2B:
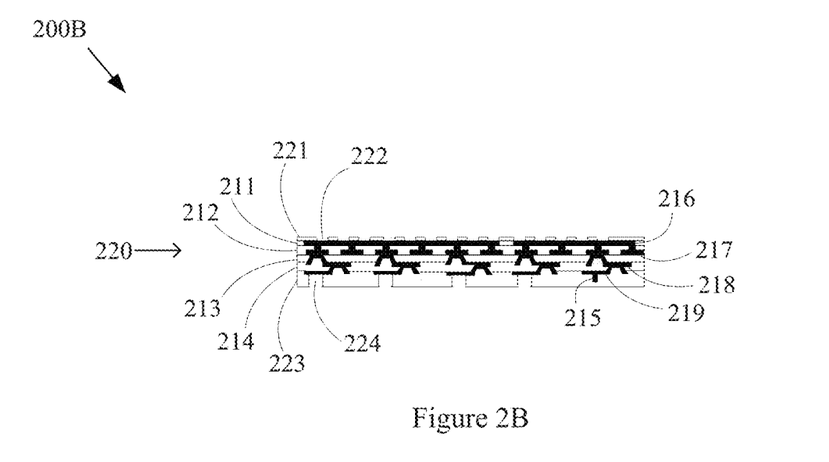

The example method 100 may, at block 120, comprise forming one or more solder resist layers and/or openings therein. Block 120 may comprise forming one or more solder resist layers and/or openings therein in any of a variety of manners, non-limiting examples of which are provided herein. FIG. 2B provides an example illustration of various aspects of block 120. Referring to FIG. 2B, an example illustration 200B of an example structure 220 is presented that includes the example RDS 210 of FIG. 2A with layers of solder resist material applied thereto.

Block 120 may, for example, comprise forming first solder resist material 221 (e.g., one or more layers thereof) on a first side of the RDS 210 of FIG. 2A. The first solder resist material 221 may, for example, comprise one or more first apertures 222 (or openings) extending therethrough to expose respective portions (e.g., pads, traces, lands, etc.) of the first conductive layer 216.

Block 120 may also, for example, comprise forming second solder resist material 223 (e.g., one or more layers thereof) on a second side of the RDS 210 of FIGS. 2A. The second solder resist material 223 may, for example, comprise one or more second apertures 224 (or openings) extending therethrough to expose respective portions of the fourth conductive layer 219. The second solder resist material 223 may also, for example, completely cover the fiducial 215. In alternative implementations, however, at least an end surface of the fiducial 215 (or an end surface and a portion of lateral side surfaces) may be exposed from the second solder resist material 223.

Block 120 may comprise forming the first solder resist material 221 and the second solder resist material 223 in any or a variety of manners. For example, block 120 may comprise forming the solder resist material 221 and 223 by spray deposition, vapor deposition, screen printing, vacuum lamination, spin coating, etc. The apertures 222 and 224 may, for example, be formed by photo-imaging, selective printing or lamination, etc. Note that any of a variety of support structures may be coupled to the structure during the forming of the first solder resist material 221 and/or second solder resist material 223.

The solder resist material 221 and 223 may comprise (or be formed using) any of a variety of dielectric materials (e.g., various polymers, various epoxies, etc.) in any of a variety of forms (e.g., liquids or inks, pastes, dry films, etc.). Note that block 120 may (but need not) form the first solder resist material 221 in the same manner as the second solder resist material 223, and the first solder resist material 221 and the second solder resist material 223 may (but need not) be formed of the same type of material.

In an example implementation, the first solder resist material 221 and the second solder resist material 223 may advantageously have different respective thicknesses. For example, the second solder resist material 223 may be at least two times as thick or at least three times as thick as the first solder resist material 221. For example, such thickness ratio may advantageously provide for RDS testability while also providing the structural integrity desired during electrical testing. For example, as discussed herein, since the second solder resist material 223 may be subjected to a later thinning process, various aspects of the present disclosure provide the flexibility to have any of a variety of thickness ratios between the first 221 and second 223 solder resist materials. To establish different respective thicknesses between the first 221 and second 223 solder resist materials, different respective materials and/or different respective processes may (but need not) be utilized to form the first 221 and second 223 solder resist materials.

In an example implementation, the first solder resist material 221 may be formed of one or more layers having a total thickness of 10-15 microns, and the second solder resist material 223 may be formed of one or more layers having a total thickness of 30-40 microns. In an example implementation, the first solder resist material 221 may have a thickness that is the same or similar (e.g., within 10% or 20%, etc.) as the thickness of one or more of the dielectric layers 211-214, and the second solder resist material 221 may have a thickness that is substantially greater (e.g., 1.5×, 2×, 3×, etc.) than the thickness of one or more of the dielectric layers 211-214.

In general, block 120 may comprise forming first solder resist material 221 on a first side of the RDS 210 and second solder resist material 223 on a second side of the RDS 210. Accordingly, the scope of various aspects of this disclosure should not necessarily be limited by characteristics of any particular solder resist layers or of any particular manner of forming such layers.

Figure 2C:
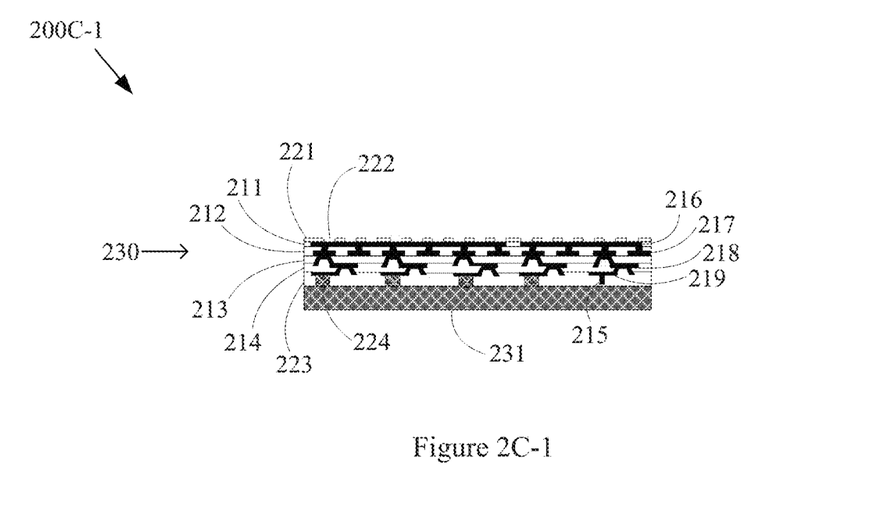
Figure 2C:
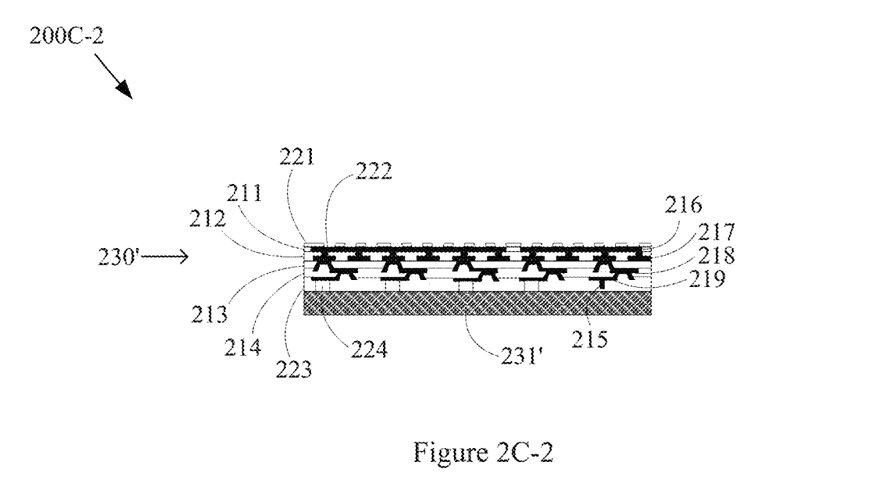

The example method 100 may, at block 130, comprise forming a carrier. Block 130 may comprise forming a carrier in any of a variety of manners, non-limiting examples of which are provided herein. FIGS. 2C-1 and 2C-2 provide example illustrations of various aspects of block 130. Referring to FIG. 2C-1, an illustration 200C-1 showing an example structure 230 comprising an example carrier 231 is presented. Referring to FIG. 2C-2, an illustration 200C-2 showing an example structure 230' comprising an example carrier 231' is presented.

Block 130 may comprise forming the carrier 231 (or 231') in any of a variety of manners. For example, block 130 may comprise pressing a pre-preg layer to the bottom side of the example structure 220 of FIG. 2B. Also for example, block 130 may comprise forming the carrier 231 by molding, printing, spraying, vapor depositing, spin coating, laminating, etc. In some examples, carrier 231 may comprise a dielectric or organic material. In some examples, the prepreg layer can comprise a resin that can be hardened or cured after attachment to structure 220. In some examples, the prepreg layer can also comprise a filler for structural integrity, such as glass, glass fiber, or glass fabric, bounded by or interspersed within the resin.

As shown in the example structure 230 of FIG. 2C-1, the example carrier 231 may fully (or at least partially) fill the second apertures 224 of the second solder resist material 223. Alternatively, as shown in the example structure 230' of FIG. 2C-2, the second apertures 224 of the second solder resist material 223 may be free (or substantially free) of the example carrier 231'.

The carrier 231 (or 231') may, for example, provide structural stability for one or more next production processes (e.g., shipping, tool loading/unloading, testing, electronic component mounting, encapsulating, cleaning, testing, singulating, etc.).

Note that although FIGS. 2C-1 and 2C-2 show a single layer of carrier material, block 130 may comprise forming the carrier 231 (or 231') of any number of layers, which may or may not be of same respective materials. For example, in an example implementation, a first layer of the carrier 231 (or 231') may comprise a layer of prepreg, and a second layer of the carrier 231 (or 231') may comprise a layer of metal foil (or a layer of a dielectric material).

In general, block 130 may comprise forming a carrier. Accordingly, the scope of various aspects of this disclosure should not necessarily be limited by characteristics of any particular type of carrier or by characteristics of any particular manner of forming a carrier.

The example method 100 may, at block 140, comprise mounting one or more electronic components. Block 140 may comprise mounting (or coupling or attaching) one or more electronic components in any of a variety of manners, non-limiting examples of which are provided herein. FIGS. 2D-1 and 2D-2 provide example illustrations of various aspects of block 140. Referring to FIG. 2D-1, an illustration 200D-1 showing an example structure 240 comprising an example component 241 mounted to the example structure 230 of FIG. 2C-1 is presented. Referring to FIG. 2D-2, an illustration 200D-2 showing an example structure 240' comprising an example component 241' mounted to the example structure 230' of FIG. 2C-2 is presented.

An electronic component may comprise characteristics of any of a variety of types of electronic components (e.g., semiconductor die, active or passive component, wiring component, shielding component, etc.). For example, the electronic component may comprise a processor die, a memory die, an application specific integrated circuit die, general logic die, active semiconductor component, resistor, capacitor, inductor, diode, transistor, shield, wire, etc.). Note that although the examples shown and discussed herein only show a single component being mounted to the RDS, any number of such components may be mounted.

Figure 2D:
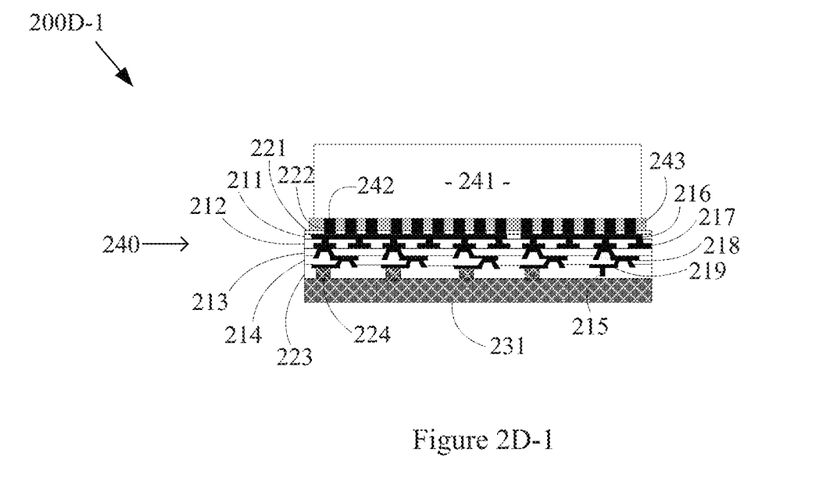
Figure 2D:
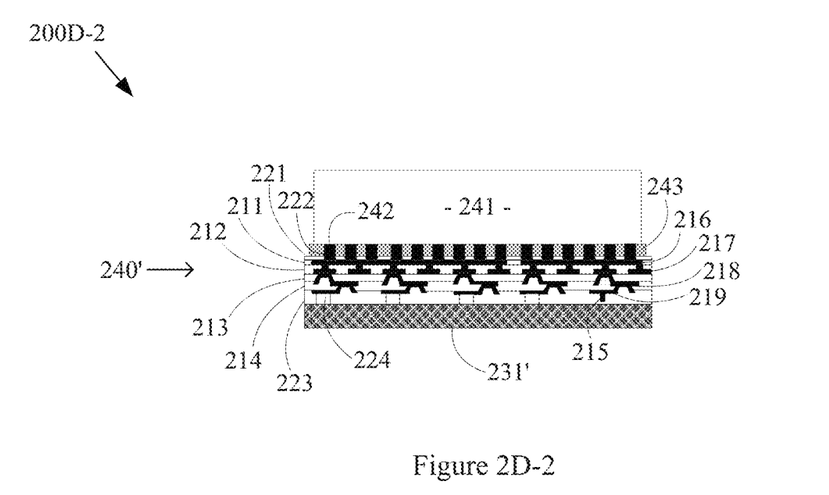

Block 140 may comprise mounting the electronic component in any of a variety of manners. For example, block 140 may comprise mounting the electronic component to the RDS utilizing mass reflow, thermocompression bonding (TCB), conductive epoxy, etc. For example, the electronic component (e.g., electronic component 241) may comprise various interconnection structures (e.g., conductive pads, lands, bumps, balls, wafer bumps, conductive pillars, etc.) formed thereon. Such interconnection structures are shown generally in FIGS. 2D-1 and 2D-2 as interconnection structures 242. Block 140 may, for example, comprise electrically and mechanically attaching such interconnection structures 242 to the RDS utilizing any of a variety of attachment processes (e.g., mass reflow, thermocompression bonding (TCB), conductive epoxy, etc.). The interconnection structures 242 may, for example, be bonded to respective portions of the first conductive layer 216 through respective first apertures 222 in the first solder resist material 221.

In general, block 140 comprises attaching one or more electronic components to the RDS. Accordingly, the scope of this disclosure should not necessarily be limited by characteristics of any particular electronic component, or by characteristics of any particular single or multi-component layout, by characteristics of any particular manner of attaching such electronic component(s), etc.

Block 140 may also, for example, comprise underfilling the mounted electronic component(s). Block 140 may comprise performing such underfilling in any of a variety of manners, non-limiting examples of which are presented herein.

For example, after the mounting of the electronic component(s), block 140 may comprise underfilling the electronic component(s) utilizing a capillary underfill. For example, the underfill may comprise a reinforced polymer material viscous enough to flow between the attached electronic component(s) and the RDS in a capillary action. Also for example, block 140 may comprise underfilling the mounted electronic component(s) utilizing a non-conductive paste (NCP) and/or a non-conductive film (NCF) or tape while the electronic component(s) are being mounted at block 140 (e.g., utilizing a thermocompression bonding process). For example, such underfill materials may be deposited (e.g., printed, sprayed, etc.) prior to attaching the electronic component(s), for example in a pre-applied underfill process. Also for example, the underfilling may also occur at a different block of the example method 100. For example, the underfilling may be performed as part of the encapsulating block 150 (e.g., utilizing a molded underfill).

FIGS. 2D-1 and 2D-2 provide example illustrations 200D-1 and 200D-2 of the underfilling. For example, the underfill 243 is positioned between the electronic component 241 and the first solder resist material 221, for example surrounding the interconnection structures 242.

Though the underfill 243 is generally illustrated to be flat, the underfill 243 may rise up and form fillets on the sides of the electronic component(s) 241. In an example scenario, at least a fourth or at least a half of the lateral side surfaces of the electronic component(s) 241 may be covered by the underfill material 243. In another example scenario, one or more or all of the entire lateral side surfaces of the electronic component(s) 241 may be covered by the underfill material 243. Also for example, a substantial portion of the space directly laterally between a plurality of the electronic components 241 may be filled with the underfill material 243. For example, in a scenario in which block 140 comprises mounting a plurality of electronic components 241, at least half of the space or all of the space between laterally adjacent electronic components 241 may be filled with the underfill material. In an example implementation, the underfill 243 may cover a top side of the entire RDS. In such example implementation, when a wafer of a plurality of RDSs is later diced, such dicing may also cut through the underfill 243.

In general, block 140 may comprise underfilling the one or more electronic components 241 mounted to the RDS at block 140. Accordingly, the scope of this disclosure should not necessarily be limited by characteristics of any particular type of underfill or of any particular manner of performing such underfilling.

Figure 2E:
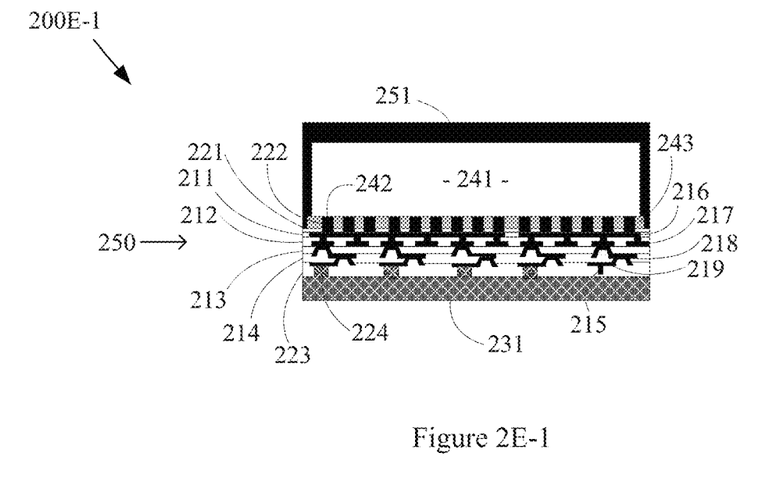
Figure 2E:
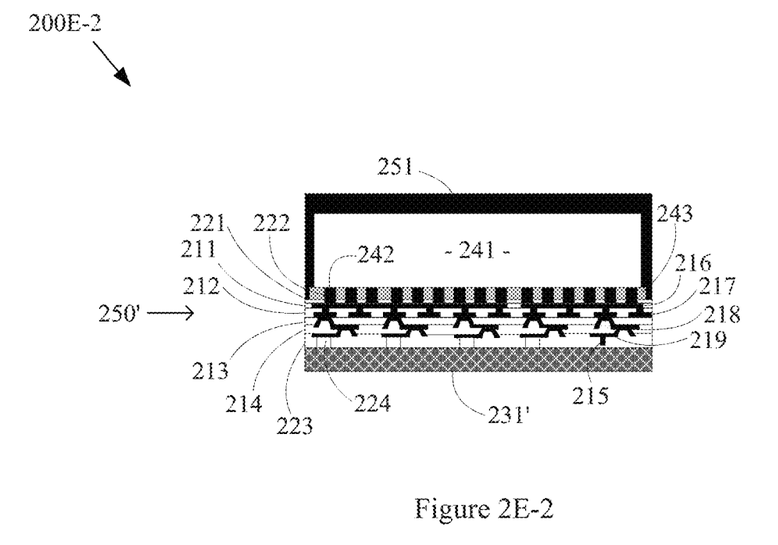

The example method 100 may, at block 150, comprise encapsulating. Block 150 may comprise encapsulating in any of a variety of manners, non-limiting examples of which are provided herein. FIGS. 2E-1 and 2E-2 provide example illustrations of various aspects of block 150. Referring to FIG. 2E-1, an illustration 200E-1 showing an example structure 250 comprising an example encapsulation 251 (or encapsulating material) is presented. Referring to FIG. 2E-2, an illustration 200E-2 showing an example structure 250' comprising an example carrier 231' is presented.

For example, block 150 may comprise molding over the top surface of the RDS (e.g., over a single RDS, over a wafer or panel of RDSs, etc.), over the electronic component(s) attached at block 140, over the underfill formed at block 140 if present, etc. Block 150 may, for example, comprise utilizing compression molding (e.g., utilizing liquid, powder and/or film) or vacuum molding. Also for example, block 150 may comprise utilizing a transfer molding process (e.g., a wafer-level transfer molding process).

The encapsulating material 251 may, for example, comprise any of a variety of characteristics. For example, the encapsulating material 251 (e.g., epoxy mold compound (EMC), epoxy resin molding compound, etc.) may comprise a relatively high modulus, for example to provide wafer support in a subsequent process.

As explained herein, for example with regard to block 140, the encapsulating process of block 150 may provide underfill 243 between the electronic component(s) 241 and the first solder resist material 221. In such an example, there may be uniformity of material between the molded underfill material 243 and the mold material 241 encapsulating the electronic component(s) 241.

FIGS. 2E-1 and 2E-2 provide example illustrations 200E-1 and 200E-2 of various aspects of block 150, for example encapsulating (e.g., molding, etc.) aspects. For example, the encapsulated assembly 250 (and 250') is shown with the encapsulating material 251 covering the electronic component(s) 241, underfill 243, and the top side of the RDS (e.g., including the dielectric layers 211-214 and conductive layers 216-219). Though the encapsulating material 251 is shown completely covering the sides and tops of the electronic component(s) 241, this need not be the case. For example, block 150 may comprise utilizing a film assist or die seal molding technique to keep the upper sides of the electronic component(s) 241 free of the encapsulating material 251.

The encapsulating material 251 may generally, for example, directly contact and cover portions of the electronic component(s) 241 that are not covered by the underfill 243. For example in a scenario in which at least a first portion of the sides of the electronic component(s) 241 is covered by underfill 243, the encapsulating material 251 may directly contact and cover a second portion of the sides of the electronic component(s) 241. The encapsulating material 251 may also, for example, fill the space between adjacent ones of a plurality of electronic component(s) 241 (e.g., at least a portion of the space that is not already filled with underfill 243).

Note that in various example scenarios, the formed encapsulating material 251 may be thinned (e.g., grinded, etc.). Such thinning may, for example, be performed merely to reduce the thickness of the encapsulating material 251, may be performed to expose a top surface of the electronic component(s) 241, etc.

Note that in various example implementations conductive vias may be formed through the encapsulating material 251, for example to provide 3D stacking characteristics of the electronic device. Many examples of such conductive vias and/or the forming thereof and many examples of encapsulating are provided in U.S. patent application Ser. No. 14/823,689, filed Aug. 11, 2015 and titled "SEMICONDUCTOR PACKAGE AND FABRICATING METHOD THEREOF," now U.S. Pat. No. 9,543,242, the contents of which are hereby incorporated herein by reference in their entirety for all purposes.

In general, block 150 may comprise encapsulating. Accordingly, the scope of this disclosure should not necessarily be limited by characteristics of any particular encapsulating material, structure and/or technique.

The example method 100 may, at block 160, comprise removing the carrier. Block 160 may comprise removing the carrier in any of a variety of manners, non-limiting examples of which are provided herein. FIGS. 2F-1 and 2F-2 provide example illustrations of various aspects of block 160. Referring to FIG. 2F-1, an illustration 200E-1 showing an example structure 260 in which most of the example carrier 231 has been removed (e.g., in comparison to the example structure 250 shown in FIG. 2E-1) is presented. Referring to FIG. 2F-2, an illustration 200E-2 showing an example structure 260' in which all (or substantially all) of the example carrier 231' has been removed (e.g., in comparison to the example structure 250' shown in FIG. 2E-1, and in comparison to the example structure 260 shown in FIG. 2F-1) is presented.

Figure 2F:
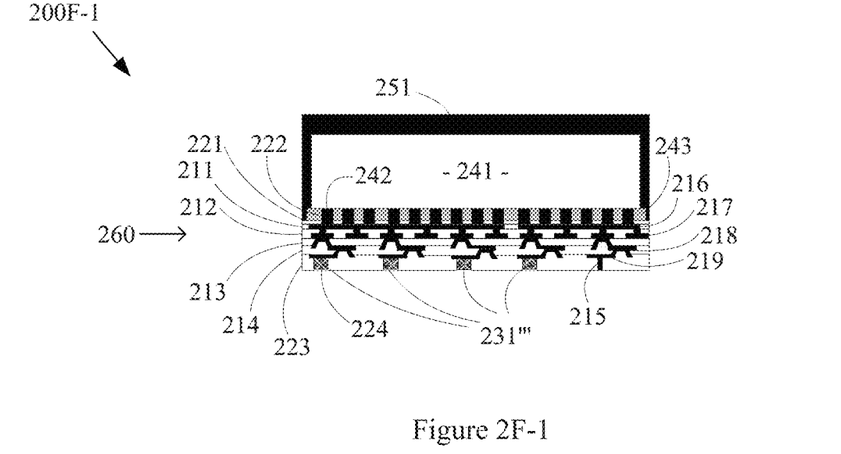

Block 160 may comprise removing the carrier in any of a variety of manners, non-limiting example of which are provided herein. For example, block 160 may comprise performing a multi-step carrier removal processes in which a bulk portion of the carrier is removed by grinding. An example of such removal is shown in FIG. 2F-1, in which most of the carrier 231 (of FIG. 2E-1) is removed by grinding, leaving only the carrier remnants 231''' positioned in the second apertures 224 of the second solder resist material 223. Block 160 may also comprise grinding (or otherwise removing) a portion of the second solder resist material 223, for example to expose an end surface of the fiducial 215 (or to alternatively expose an end surface and an end part of lateral side surfaces of the fiducial 215).

Note that in a scenario in which the carrier formed at block 130 was not formed in the second apertures 224 (e.g., as shown at FIG. 2C-2 carrier 231'), the block 160 grinding (or other removal) process may result in the example 260' of FIG. 2F-2, for example resulting in the complete removal of the carrier 231'.

Also note that although grinding is presented as an example, block 160 may also comprise utilizing one or more alternative bulk removal processes (e.g., peeling, sheering, etching, etc.).

Figure 2F:
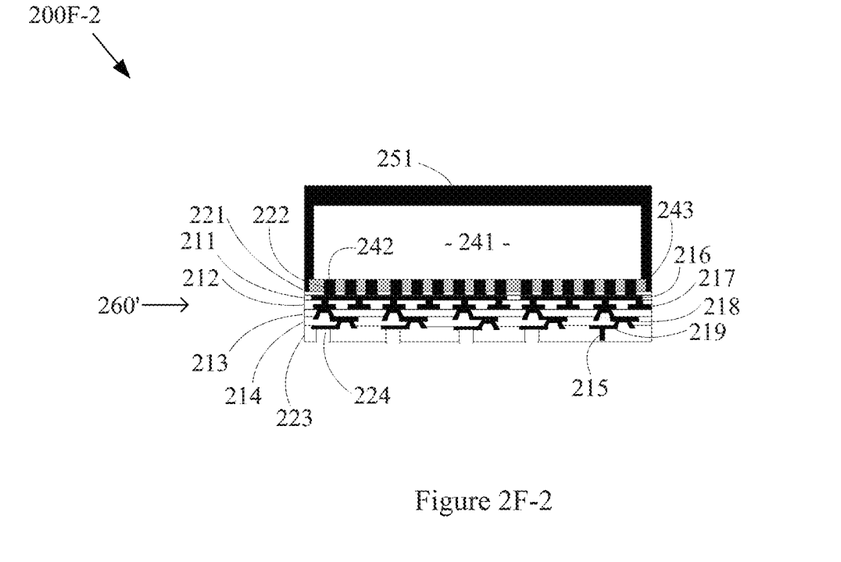

Additionally, note that even after the grinding (or other bulk removal process), the thickness of the second solder resist material 223 may be substantially greater (e.g., 2× or more, 3× or more, etc.) than the thickness of the first solder resist material 221. Such thickness may, for example enhance structural stability, enhance formation of interconnection structures (e.g., at block 170), provide space for the fiducial 215 while protecting portions of the fourth conductive layer 219, etc.

After the grinding (or other bulk removal) process, block 160 may comprise performing one or more additional carrier removal processes, for example fine material removal processes, to remove remnants. For example, block 160 may comprise utilizing laser ablation to remove the remnants 231''' of the carrier 231. Such laser ablation may, for example, result in the example structure 260' shown in FIG. 2F-2, for example with the remnants 231''' removed from the second apertures 224 in the second solder resist material 223. Such removal may, for example result in the exposure of portions (e.g., pads, lands, traces, etc.) of the fourth conductive layer 219 through the second apertures 224, for example for later attachment to various conductive interconnection structures (e.g., at block 170).

Such laser ablation may also remove a portion of the second solder resist material 223, for example portions of the second solder resist material 223 bounding the second apertures 224. In an example implementation, the second solder resist material 223 bounding the second apertures 224 may comprise vertical sidewalls (or substantially vertically sidewalls, for example within 2% or 5% of being vertical). Such a vertical sidewall implementation is shown in the example illustration 200E-2 of FIG. 2F-2. In another example implementation, the second solder resist material 223 bounding the second apertures 224 may comprise sloped sidewalls (e.g., with a slope greater than 0.05, greater than 0.1, greater than 0.2, etc.). Such a slope may, for example assist with the formation of the interconnection structures (e.g., at block 170). Note that in an example implementation including such sloped sidewalls, the sidewalls may be sloped initially (e.g., in the example structure 220 of FIG. 2B) and/or may be sloped after removal of the carrier at block 160 (e.g., due to ablation, etc.).

Note that block 160 may comprise utilizing material removal processes in addition to or instead of laser ablation (e.g., masking and/or etching, drilling, etc.).

Also note that in various example implementations, remnants of the carrier 231 (e.g., within the second apertures 224, etc.) may remain after block 170 is complete. Such remnants may, for example, enhance structural stability of the electronic device while allowing for proper electrical and/or mechanical connection.

In general, block 160 may comprise removing the carrier. Accordingly, the scope of various aspects of this disclosure should not necessarily be limited by characteristics of any particular type of carrier or by characteristics of any particular manner of removing a carrier.

Figure 2G:
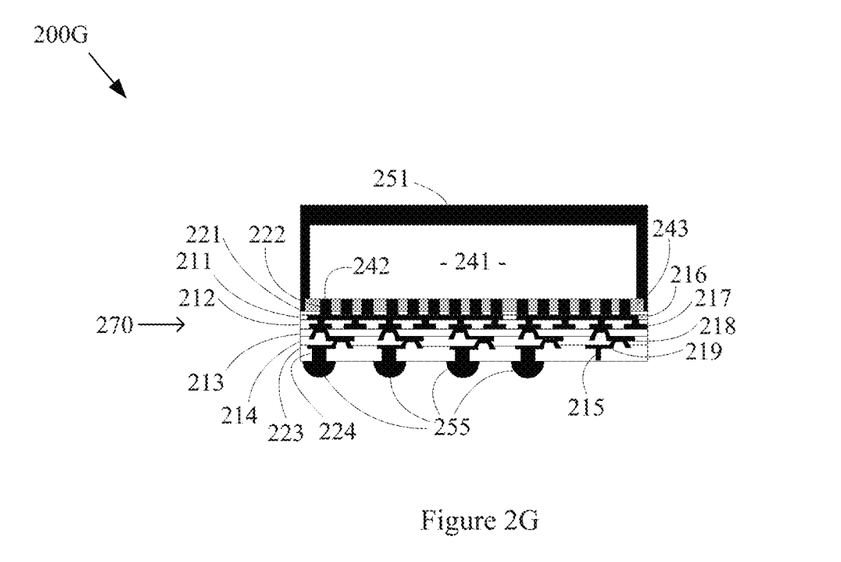

The example method 100 may, at block 170, comprise forming conductive interconnection structures. Block 170 may comprise forming conductive interconnection structures in any of a variety of manners, non-limiting examples of which are provided herein. FIG. 2G provides an example illustration of various aspects of block 170. Referring to FIG. 2G, an illustration 200G is presented showing an example structure 270 in which example conductive interconnection structures 255 have been formed is presented.

The conductive interconnection structures 255 may comprise any of a variety of characteristics. For example, a conductive interconnection structures 255 may comprise a conductive ball or bump (e.g., a solder ball or bump, wafer bump, etc.). For example, in an example implementation including a solder ball or bump, such ball or bump may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosure is not limited thereto. Block 170 may comprise forming or attaching such conductive interconnection structures by ball-dropping, bumping, metal-plating, pasting and reflowing, etc. For example, block 170 may comprise dropping a conductive ball on a conductive pad (or other exposed conductor), reflowing, and cooling.

Also for example, a conductive interconnection structure 255 may comprise a metal (e.g., copper, etc.) pillar or post. In such a scenario, block 170 may, for example, comprise forming conductive pillars on respective interconnection pads (e.g., respective portions of the fourth conductive layer 219 exposed at block 160) or any other exposed conductive layer portion. Block 170 may, for example, comprise forming such metal pillars or posts by electroplating, electroless plating, bonding wires, etc. Block 170 may also, for example, comprise forming a solder cap on an end of a metal pillar or post that is exposed from the second solder resist material 223.

The interconnection structures 255 may, for example, fill the second apertures 224 of the second solder resist material 223. The interconnection structures 255 may also, for example, protrude from the second apertures 224. In the example structure 270 shown in FIG. 2G, the interconnection structures 255 also cover a portion of a lower side of the second solder resist material 223 around the perimeter of the apertures 224.

Note that under bump metallization may be formed at block 170 and/or under bump metallization may be received or formed at block 110.

In general, block 170 may comprise forming interconnection structures. Accordingly, the scope of various aspects of this disclosure should not necessarily be limited by characteristics of any particular type of interconnection structure or by characteristics of any particular manner of forming an interconnection structure.

The example method 100 may, at block 180, comprise singulating the electronic device. Block 180 may comprise singulating the electronic device in any of a variety of manners, non-limiting examples of which are provided herein.

For illustrative clarity, the discussion herein has generally focused on the manufacturing of a single electronic device. It should be understood that all of the process steps (or blocks) discussed herein may be performed on an entire wafer or panel of connected electronic devices. For example, each of the illustrations provided at FIGS. 2A-2G may be replicated tens or hundreds of times on a single wafer or panel. For example, until singulating (or dicing), there might be no separation between one of the illustrated electronic devices or structures and a neighboring electronic device or structure.

Block 180 may, for example, comprise performing such singulating in any of a variety of manners (e.g., mechanical punch-cutting, mechanical saw-cutting, laser cutting, soft beam cutting, plasma cutting, etc.). The end result of such singulating may, for example, be the example electronic device structure 270 shown in FIG. 2G. For example, the singulating may form side surfaces of the electronic device structure 270 comprising coplanar side surfaces of a plurality of components of the device. For example, any or all of cut side surfaces of the electronic device (e.g., encapsulating material 251, underfill 243, solder resist materials 221 and 223, dielectric layers 211-214, and/or conductive layers 216-219, etc.) may be coplanar.

In general, block 180 may comprise singulating the electronic device. Accordingly, the scope of this disclosure should not be limited by characteristics of any particular manner of singulating or by characteristics of any particular singulated device.

The example method 100 may, at block 195, comprise continuing execution of the method 100. Block 195 may comprise continuing execution of the method 100 in any of a variety of manners, non-limiting examples of which are provided herein.

Block 195 may, for example, comprise directing execution flow to any of the blocks of the example method 100 (or any portion of any of such blocks). Block 195 may, for example, comprise performing testing, cleaning, packaging, shipping, etc.

The discussion herein included numerous illustrative figures that showed various portions of an electronic device and manufacturing method thereof. For illustrative clarity, such figures did not show all aspects of each example assembly. Any of the example structures or assemblies presented herein may share any or all characteristics with any or all other example structures or assemblies presented herein.

In an example implementation a method of manufacturing an electronic device is provided, where the method comprises: receiving a first structure comprising: a redistribution structure (RDS) comprising a top RDS side, a bottom RDS side, and a lateral RDS side, wherein the RDS comprises at least one dielectric material and at least one conductive material; a bottom solder resist (SR) material on the bottom RDS side and comprising a top SR side, a bottom SR side, and a lateral SR side, wherein the bottom SR material comprises a bottom SR aperture that exposes a respective portion of the bottom RDS side from the bottom SR material; and a carrier on the bottom SR side, wherein a portion of the carrier is positioned in the bottom SR aperture. At least one electronic component is mounted to the top RDS side. At least a portion of the electronic component and at least a portion of the top RDS side are encapsulated in an encapsulating material. At least most of the carrier is removed by, at least in part, removing a first part of the carrier and removing a second part of the carrier, where the second part of the carrier comprises at least some of the portion of the carrier that is positioned in the bottom SR aperture. A conductive interconnection structure may, for example, be formed on the bottom RDS side and electrically connected to the at least one conductive material of the RDS through the bottom SR aperture.

Removing the second part of the carrier may, for example, comprise laser ablating the second part of the carrier. Removing the first part of the carrier may, for example, comprise grinding the second part of the carrier. A portion of the bottom SR side may, for example, be removed. Also, the at least one conductive material of the received first structure may, for example, comprise a metal fiducial, and the removing of the portion of the bottom SR side may, for example, comprise exposing at least a bottom end surface of the metal fiducial from the bottom SR material.

The carrier may, for example, comprise a prepreg material. In an example implementation, the carrier may comprise a single layer of a material that directly contacts the bottom SR material. For example, in an example implementation, the carrier may comprise a single layer of material without any interface (or intermediate) material (e.g., adhesive, etc.) between the bottom SR material and the single layer of material. In an example implementation, the at least one conductive material of the RDS may comprise a bottom conductive layer, and the bottom SR material may cover a bottom side and a lateral side of the bottom conductive layer. Also for example, a portion of the bottom conductive layer is exposed from the bottom SR material through the bottom SR aperture. Additionally for example, the encapsulating material may comprise a lateral side that is coplanar with the lateral SR side. In an example implementation, the first structure may comprise a top solder resist (SR) material on the top RDS side, a top side of the first structure may comprise a top side of the top SR material, and a bottom side of the first structure may comprise a bottom side of the carrier.

In an example implementation, a method of manufacturing an electronic device is provided. The method may, for example, comprise receiving a first structure comprising: a redistribution structure (RDS) comprising a top RDS side, a bottom RDS side, and a lateral RDS side, wherein the RDS comprises at least one dielectric material and at least one conductive material; a first solder resist (SR) material on the bottom RDS side and comprising a first top SR side, a first bottom SR side, and a first lateral SR side, wherein the first SR material comprises a first SR aperture that exposes a respective portion of the bottom RDS side from the first SR material; a second solder resist (SR) material on the top RDS side and comprising a second top SR side, a second bottom SR side, and a second lateral SR side, wherein the second SR material comprises a second SR aperture that exposes a respective portion of the top RDS side from the second SR material; and a carrier on the first bottom SR side, wherein a portion of the carrier is positioned in the first SR aperture. The method may, for example, comprise mounting an electronic component to the top RDS side, encapsulating at least a portion of the electronic component and at least a portion of the top RDS side in an encapsulating material, removing at least most of the carrier, and forming a conductive interconnection structure on the bottom RDS side and electrically connected to the at least one conductive material of the RDS through the first bottom SR aperture.

Removing the carrier may, for example, comprise grinding a first part of the carrier; and laser ablating a second part of the carrier, where the second part of the carrier comprises at least some of the portion of the carrier that is positioned in the first SR aperture. The first SR material of the received first structure may, for example, be thicker than the second SR material of the received first structure. The first SR material of the received first structure may, for example, be at least two times as thick as the second SR material of the received first structure. The method may, for example, comprise removing a portion of the first bottom SR side, wherein after said removing the portion of the first bottom SR side, the first SR material is at least two times as thick as the second SR material. In an example implementation, a top side of the first structure may comprise the second top SR side; and a bottom side of the first structure may comprise the first bottom SR side. In an example implementation, a top surface of the at least one conductive material of the RDS is covered by the second SR material and no lateral surface of the at least one conductive material is covered by the second SR material, and a bottom surface and a lateral surface of the at least one conductive material of the RDS is covered by the first SR material.

In an example implementation, an electronic device is provided. The electronic device may, for example, comprise a redistribution structure (RDS) comprising a top RDS side, a bottom RDS side, and a lateral RDS side, wherein the RDS comprises at least one dielectric material and at least one conductive material; a bottom solder resist (SR) material on the bottom RDS side and comprising a top SR side, a bottom SR side, and a lateral SR side, wherein the bottom SR material comprises a bottom SR aperture that exposes a respective portion of the bottom RDS side from the bottom SR material; and a carrier on the bottom SR side, wherein a portion of the carrier is positioned in the bottom SR aperture.

In an example implementation, the electronic device may comprise a top solder resist (SR) material on the top RDS side and comprise a top SR aperture that exposes a respective portion of the top RDS side. The electronic device may, for example, be one of a plurality of same electronic devices of a wafer or panel.

In summary, various aspects of this disclosure provide a semiconductor device or package structure and a method for making thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing an electronic component, the method comprising:
   forming a redistribution structure (RDS) comprising a top redistribution structure (RDS) side, a bottom redistribution structure (RDS) side, and a lateral redistribution structure (RDS) side, where the redistribution structure (RDS) comprises at least one dielectric material and at least one conductive material, and where:
     the at least one conductive material of the redistribution structure (RDS) comprises a metal fiducial exposed at the bottom redistribution structure (RDS) side, and
     said forming the redistribution structure (RDS) comprises forming pads at the top redistribution structure (RDS) side for attaching a semiconductor die to the redistribution structure (RDS);
   forming a bottom solder resist (SR) material on the bottom redistribution structure (RDS) side and comprising a top solder resist (SR) side, a bottom solder resist (SR) side, and a lateral solder resist (SR) side, where the bottom solder resist (SR) material comprises a bottom solder resist (SR) aperture that exposes a respective portion of the bottom redistribution structure (RDS) side through the bottom solder resist (SR) material; and
   forming a carrier on the bottom solder resist (SR) side, where a portion of the carrier is positioned in the bottom solder resist (SR) aperture.

2. The method of claim 1, where said forming the carrier comprises:
   forming a carrier material; and
   after said forming the carrier material, removing a portion of the carrier material.

3. The method of claim 2, wherein said removing the portion of the carrier material comprises grinding the portion of the carrier material.

4. The method of claim 1, wherein said forming the redistribution structure (RDS) comprises forming under bump metallization at the bottom redistribution structure (RDS) side, for attaching a conductive interconnection structure to the redistribution structure (RDS).

5. The method of claim 1, comprising removing a portion of the bottom solder resist (SR).

6. The method of claim 1, wherein said forming the carrier comprises pressing a pre-preg material on the bottom solder resist (SR) side and into the bottom solder resist (SR) aperture.

7. The method of claim 1, wherein the carrier comprises only a single layer of material that directly contacts the bottom solder resist (SR) material.

8. The method of claim 1, wherein:
   the at least one conductive material of the redistribution structure (RDS) comprises a bottom conductive layer;
   the bottom solder resist (SR) material covers a bottom side and a lateral side of the bottom conductive layer; and
   a portion of the bottom conductive layer is exposed through the bottom solder resist (SR) material through the bottom solder resist (SR) aperture.

9. A method of manufacturing an electronic component, the method comprising:
   forming a redistribution structure (RDS) comprising a top redistribution structure (RDS) side, a bottom redistribution structure (RDS) side, and a lateral redistribution structure (RDS) side, where the redistribution structure (RDS) comprises at least one dielectric material and at least one conductive material;
   forming a first solder resist (SR) material on the bottom redistribution structure (RDS) side and comprising a first top solder resist (SR) side, a first bottom solder resist (SR) side, and a first lateral solder resist (SR) side;
   forming a second solder resist (SR) material on the top redistribution structure (RDS) side and comprising a second top solder resist (SR) side, a second bottom solder resist (SR) side, and a second lateral solder resist (SR) side, where the second solder resist (SR) material comprises a second solder resist (SR) aperture that exposes a respective portion of the top redistribution structure (RDS) side through the second solder resist (SR) material, and where a thickness of the first solder resist (SR) material is at least two times as thick as a thickness of the second solder resist (SR) material; and
   forming a carrier on the first bottom solder resist (SR) side.

10. The method of claim 9, wherein said forming the redistribution structure (RDS) comprises forming pads at the top redistribution structure (RDS) side for attaching a semiconductor die to the redistribution structure (RDS).

11. The method of claim 9, wherein said forming the carrier comprises:
    forming a carrier material; and
    after said forming the carrier material, removing a portion of the carrier material.

12. The method of claim 11, wherein said removing the portion of the carrier material comprises grinding the portion of the carrier material.

13. The method of claim 9, wherein said forming the carrier on the first bottom solder resist (SR) side comprises forming a portion of the carrier in the first solder resist (SR) aperture.

14. The method of claim 9, wherein:
    a top surface of the at least one conductive material of the redistribution structure (RDS) is covered by the second solder resist (SR) material and no lateral surface of the at least one conductive material is covered by the second solder resist (SR) material; and
    a bottom surface and a lateral surface of the at least one conductive material of the redistribution structure (RDS) is covered by the first solder resist (SR) material.

* * * * *